(12) United States Patent
Takeuchi et al.

(10) Patent No.: US 10,994,589 B2
(45) Date of Patent: May 4, 2021

(54) ELECTRIC VEHICLE

(71) Applicant: HONDA MOTOR CO., LTD., Tokyo (JP)

(72) Inventors: Yoshiyuki Takeuchi, Wako (JP); Shinichirou Wakou, Wako (JP); Ryoma Taguchi, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 152 days.

(21) Appl. No.: 16/218,515

(22) Filed: Dec. 13, 2018

(65) Prior Publication Data

US 2019/0193522 A1 Jun. 27, 2019

(30) Foreign Application Priority Data

Dec. 21, 2017 (JP) .............................. JP2017-245587

(51) Int. Cl.
| | |
|---|---|
| *B60H 1/32* | (2006.01) |
| *B60L 7/14* | (2006.01) |
| *G01R 19/165* | (2006.01) |
| *H02J 7/00* | (2006.01) |
| *B60L 3/00* | (2019.01) |
| *B60H 1/00* | (2006.01) |

(52) U.S. Cl.
CPC ....... *B60H 1/3208* (2013.01); *B60H 1/00921* (2013.01); *B60L 3/0046* (2013.01); *B60L 7/14* (2013.01); *G01R 19/16542* (2013.01); *H02J 7/0029* (2013.01); *H02J 7/00306* (2020.01)

(58) Field of Classification Search
CPC ...... B60L 2240/34; B60L 58/13; B60L 58/15; B60L 1/003; B60L 15/2009; B60L 7/10; B60L 1/02; B60L 2240/662
See application file for complete search history.

(56) References Cited

U.S. PATENT DOCUMENTS

2013/0131919 A1* 5/2013 Pan ...................... B60H 1/3208
701/36

FOREIGN PATENT DOCUMENTS

| JP | 2005-322454 | 11/2005 |
|---|---|---|
| JP | 2015-162947 | 9/2015 |

(Continued)

OTHER PUBLICATIONS

Shimonagayoshi, Vehicular Control Device, Sep. 7, 2015, JP2015162947A, Whole Document (Year: 2015).*

(Continued)

*Primary Examiner* — Larry L Furdge
(74) *Attorney, Agent, or Firm* — Amin, Turocy & Watson, LLP

(57) ABSTRACT

An electric vehicle includes an electric motor, an electrical storage device, an air-conditioning apparatus and a controller. A coolant circuit of the air-conditioning apparatus has a compressor, an outdoor heat exchanger, an expansion valve for cooling, and an evaporator. The evaporator has a heat storage member. In a case in which regenerative braking by the electric motor is performed when the state of charge of the electrical storage device is the predetermined value or more, the controller controls the air-conditioning apparatus such that a temperature of the evaporator is decreased so as to be lower than a temperature of the evaporator when a state of charge of the electrical storage device is less than a predetermined value.

7 Claims, 5 Drawing Sheets

(56) References Cited

FOREIGN PATENT DOCUMENTS

| JP | 2015162947 A | * | 9/2015 |
|----|--------------|---|--------|
| JP | 2017-114379 | | 6/2017 |
| JP | 2017-189079 | | 10/2017 |
| JP | 2017-208898 | | 11/2017 |

OTHER PUBLICATIONS

Japanese Office Action for Japanese Patent Application No. 2017-245587 dated Jul. 30, 2019.

* cited by examiner

ELECTRIC VEHICLE

CROSS-REFERENCE TO RELATED APPLICATION

Priority is claimed on Japanese Patent Application No. 2017-245587, filed Dec. 21, 2017, the content of which is incorporated herein by reference.

BACKGROUND OF THE INVENTION

Field of the Invention

The present invention relates to an electric vehicle.

Description of Related Art

In an electric vehicle, an electric motor functions as a generator upon braking of a vehicle. That is, rotation of the driving wheels is transmitted to an output shaft of the electric motor, and electric power is regenerated by the electric motor due to rotation of the output shaft. The regenerated alternating current is converted into direct current by an inverter, and the converted direct current is supplied to an electrical storage device (a battery) from the inverter and the converted direct current is charged into the electrical storage device.

In an electric vehicle, in order to protect the electrical storage device from overcharging, when a state of charge of the electrical storage device exceeds a predetermined value, a configuration of restricting a regeneration amount in the electric motor is known. However, when a regeneration amount in the electric motor is restricted, a regenerative braking force gets weaker than usual, and this gives an occupant an uncomfortable feeling due to the variation in brake feeling. Meanwhile, when reduction in variation in brake feeling is given priority and restriction of the regeneration amount during braking is eliminated, deterioration of the electrical storage device due to overcharging occurs.

As a countermeasure, a means configured to increase electric power consumption of an electric load mounted on an electric vehicle when a state of charge of the electrical storage device exceeds a predetermined value upon generation of a regenerative braking force has been disclosed.

For example, an electric vehicle configured to operate both of a cooling apparatus for cooling an inside of a passenger compartment and a heating apparatus for heating the inside of the passenger compartment when a state of charge of the electrical storage device exceeds a predetermined value during regenerative braking by the electric motor has been devised (for example, see Japanese Unexamined Patent Application, First Publication No. 2015-162947).

In the case of the electric vehicle, when the state of charge of the electrical storage device exceeds a predetermined value during the regenerative braking by the electric motor, an abrupt variation in temperature in the passenger compartment is minimized because the cooling apparatus that is an electric load of the vehicle consumes a large amount of electric power and the heating apparatus is operated in parallel.

SUMMARY OF THE INVENTION

In the electric vehicle disclosed in Japanese Unexamined Patent Application, First Publication No. 2015-162947, electric power of an electrical storage device is consumed by simultaneously operating the cooling apparatus and the heating apparatus, and thus, overcharging upon regenerative braking is prevented. However, in the case of this electric vehicle, since electric power is wastefully consumed upon traveling of the vehicle, this is not preferable from a viewpoint of efficient use of energy.

An aspect of the present invention is directed to providing an electric vehicle capable of minimizing an abrupt increase of a state of charge of an electrical storage device to a predetermined value or more upon regenerative braking by an electric motor and effectively using energy consumed by an air-conditioning apparatus upon regenerative braking.

(1) An electric vehicle according to an aspect of the present invention includes an electric motor; an electrical storage device electrically connected to the electric motor; an air-conditioning apparatus configured to perform air conditioning in a passenger compartment; and a controller that controls the electric motor, the electrical storage device and the air-conditioning apparatus, wherein the air-conditioning apparatus includes a coolant circuit through which a coolant circulates, the coolant circuit has: a compressor configured to compress and eject a suctioned coolant; an outdoor heat exchanger configured to perform heat exchange between the coolant compressed by the compressor and an external air; an expansion valve configured to decompress the coolant that has performed heat exchange in the outdoor heat exchanger; and an indoor heat exchanger that is configured to perform heat exchange between the coolant decompressed by the expansion valve and conditioning air in a vehicle and that is configured to return the coolant to the compressor, the indoor heat exchanger has a heat storage section configured to store cold heat generated in the indoor heat exchanger, and in a case in which a regenerative braking by the electric motor is performed when a state of charge of the electrical storage device is a predetermined value or more, the controller controls the air-conditioning apparatus such that a temperature of the indoor heat exchanger is decreased so as to be lower than a temperature of the indoor heat exchanger when the state of charge of the electrical storage device is less than a predetermined value.

According to the configuration of above mentioned (1), in the case in which the regenerative braking by the electric motor is performed when the state of charge of the electrical storage device is the predetermined value or more, the air-conditioning apparatus is controlled such that the temperature of the indoor heat exchanger is decreased so as to be lower than the temperature of the indoor heat exchanger when the state of charge of the electrical storage device is less than the predetermined value. Here, for example, since the rotational speed of the compressor is increased, a large amount of electric power of the electrical storage device is consumed. Accordingly, the state of charge of the electrical storage device is decreased or a rate of increase of the state of charge is minimized Meanwhile, the cold heat accumulated in the indoor heat exchanger including the heat storage section upon regenerative braking can cause heat exchange to be performed with the conditioning air in the vehicle after termination of regenerative braking. Accordingly, energy (electric power) consumed upon regenerative braking can be effectively used after termination of regenerative braking.

(2) In the aspect of above mentioned (1), the air-conditioning apparatus may include an air-conditioning duct through which the conditioning air blown out into the passenger compartment flows, the indoor heat exchanger may be disposed in the air-conditioning duct, and an internal and external air adjusting section configured to adjust a flow rate ratio between an internal air and the external air introduced into the air-conditioning duct may be installed in the air-conditioning duct, and in a case in which a regenerative braking by the electric motor is performed when the state of charge of the electrical storage device is the predetermined value or more, the controller may control the air-conditioning apparatus such that the temperature of the indoor heat exchanger is decreased so as to be lower than the temperature of the indoor heat exchanger when the state of charge of the electrical storage device is less than the predetermined value, and control the internal and external air adjusting section such that the internal air is introduced into the air-conditioning duct.

In the case in which the regenerative braking by the electric motor is performed when the state of charge of the electrical storage device is the predetermined value or more, the internal air in the passenger compartment is introduced to circulate through the air-conditioning duct while the air-conditioning apparatus is controlled such that the temperature of the indoor heat exchanger is decreased so as to be lower than the temperature of the indoor heat exchanger when the state of charge of the electrical storage device is less than the predetermined value. As a result, for example, the indoor heat exchanger is cooled efficiently at an early stage while electric power of the electrical storage device is consumed by the compressor or the like. Accordingly, in the case in which the configuration of above mentioned (2) is employed, the cold heat can be efficiently accumulated in the indoor heat exchanger including the heat storage section while promoting electric power consumption of the electrical storage device.

(3) According to the aspect of above mentioned (1) or (2), the air-conditioning apparatus may include an air-conditioning duct through which the conditioning air blown out into the passenger compartment flows, the indoor heat exchanger may be disposed in the air-conditioning duct, a heat exchanger for raising a temperature of air therearound and an air mix door configured to adjust a ratio between air passing through the heat exchanger for raising the temperature and air bypassing the heat exchanger for raising the temperature may be disposed in the air-conditioning duct at a downstream side of the indoor heat exchanger, and in a case in which a regenerative braking by the electric motor is performed when the state of charge of the electrical storage device is the predetermined value or more, the controller may control the air-conditioning apparatus such that the temperature of the indoor heat exchanger is decreased so as to be lower than the temperature of the indoor heat exchanger when the state of charge of the electrical storage device is less than the predetermined value, and control the air mix door such that a proportion of the conditioning air passing through the heat exchanger for raising a temperature is increased.

In the case in which regenerative braking by the electric motor is performed when the state of charge of the electrical storage device is the predetermined value or more, a proportion of the conditioning air passing through the heat exchanger for raising a temperature is increased while the air-conditioning apparatus is controlled such that the temperature of the indoor heat exchanger is decreased so as to be lower than the temperature of the indoor heat exchanger when the state of charge of the electrical storage device is less than the predetermined value. As a result, most of the conditioning air cooled by the indoor heat exchanger is heated by the heat exchanger for raising a temperature, and excessive cooling of the conditioning air blown out of the air-conditioning duct is avoided.

(4) In the aspect of above mentioned (3), an air blowing section configured to deliver air to the indoor heat exchanger may be installed at an upstream of the indoor heat exchanger in the air-conditioning duct, and, in a state in which the temperature of the indoor heat exchanger has been lowered, the controller may control the air-conditioning apparatus such that an air blowing amount of the air blowing section is decreased when the state of charge of the electrical storage device has become less than the predetermined value.

In this case, an air volume of cold air blown out of the air-conditioning duct is minimized, and comfort of an occupant in the passenger compartment is appropriately maintained.

According to the aspect of the present invention, in the case in which regenerative braking by the electric motor is performed when the state of charge of the electrical storage device is the predetermined value or more, since the air-conditioning apparatus is controlled such that the temperature of the indoor heat exchanger is decreased so as to be lower than the temperature of the indoor heat exchanger when the state of charge of the electrical storage device is less than the predetermined value, when the state of charge of the electrical storage device is the predetermined value or more, an abrupt increase in the state of charge of the electrical storage device due to the regenerative braking can be minimized. In addition, according to the aspect of the present invention, since the electric power consumed upon regenerative braking can be accumulated as cold heat in the indoor heat exchanger including the heat storage section, heat exchange between the accumulated cold heat and the conditioning air in the vehicle can be performed after termination of regenerative braking. Accordingly, when the aspect of the present invention is employed, energy consumed by the air-conditioning apparatus upon regenerative braking can be effectively used after termination of regenerative braking.

DETAILED DESCRIPTION OF THE INVENTION

Hereinafter, an embodiment of the present invention will be described with reference to the accompanying drawings.

Further, in the following description, while an electric vehicle driven using only the electric power of an electrical storage device (a battery) as an electric vehicle with no engine (internal combustion engine) is exemplified, the electric vehicle is not limited thereto. For example, the electric vehicle may be a vehicle such as a hybrid vehicle (HV), a fuel cell vehicle (FCV), or the like.

Figure 1:
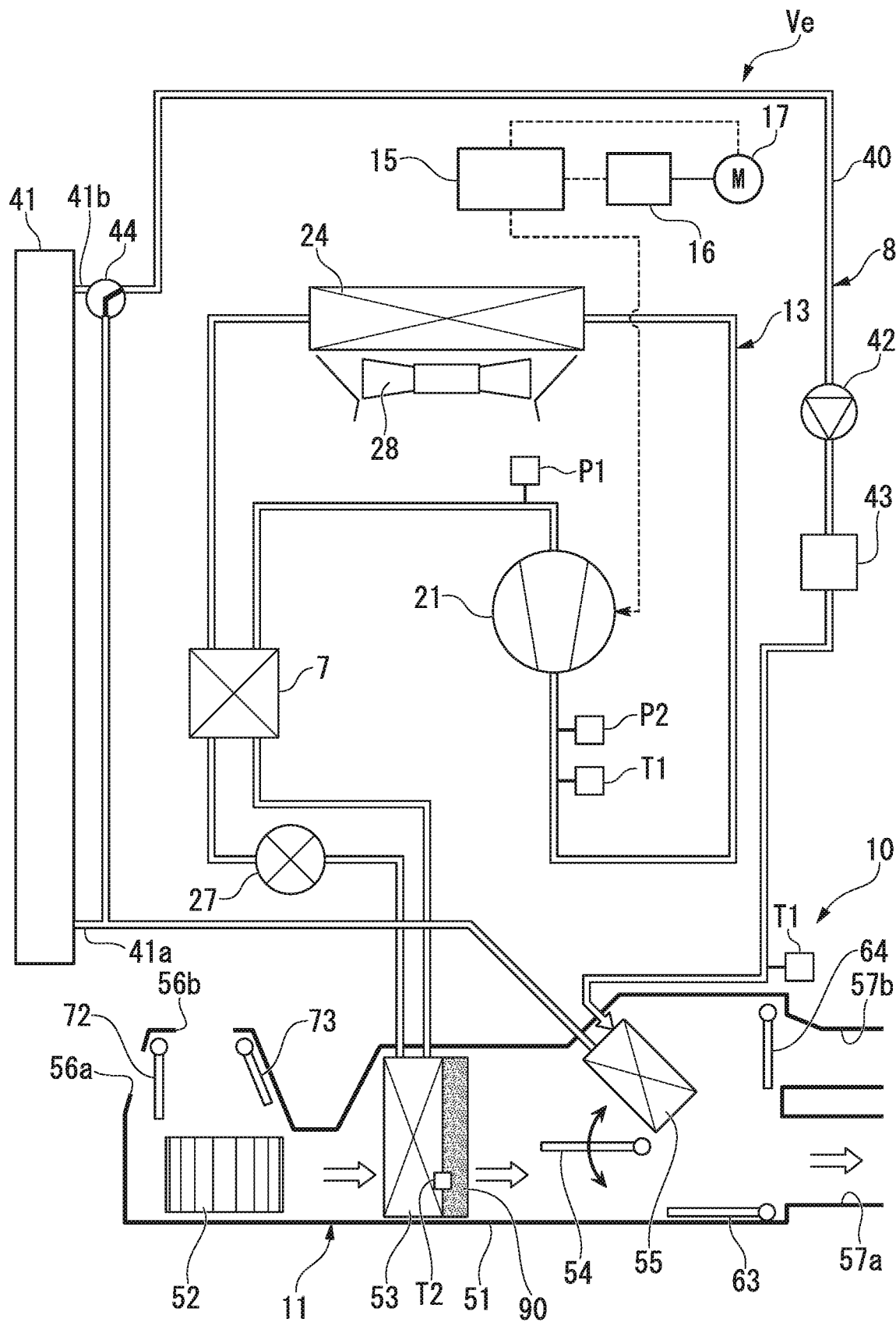
FIG. 1 is a configuration view centered on an air-conditioning apparatus of an electric vehicle according to an embodiment of the present invention.

FIG. 1 is a view showing a configuration of an electric vehicle Ve of the embodiment.

As shown in FIG. 1, the electric vehicle Ve includes an electric motor 17 for driving a vehicle, an electrical storage device 16 (a battery) that is chargeable, an air-conditioning apparatus 10 configured to perform air conditioning in a passenger compartment, and a control device 15 (an electronic control unit (ECU)) configured to control them.

The electric motor 17 is electrically connected to the electrical storage device 16 via an inverter (not shown). Upon driving of the electric motor 17, direct current output from the electrical storage device 16 is converted into alternating current by the inverter and supplied to the electric motor 17. Since alternating current is supplied to the electric motor 17, the electric motor 17 generates a driving force. Since the electric motor 17 generates a driving force, driving wheels are rotated and driven in a forward direction or a backward direction.

Meanwhile, upon braking of the electric vehicle Ve, the electric motor 17 functions as a generator. That is, rotation of the driving wheels is transmitted to an output shaft of the electric motor 17, and electric power is regenerated at the electric motor 17 due to rotation of the output shaft. Here, the electric motor 17 becomes a resistance, and the resistance acts in the electric vehicle Ve as a regeneration braking force. Alternating current regenerated by the electric motor 17 is converted into direct current by the inverter. The converted direct current is supplied to the electrical storage device 16 from the inverter and stored in the electrical storage device 16.

The air-conditioning apparatus 10 includes an air conditioning unit 11, a coolant circuit 13 for cooling, and a hot water circuit 8 for heating.

The air conditioning unit 11 includes an air-conditioning duct 51 through which conditioning air flows, a blower 52 (an air blowing section) accommodated in the air-conditioning duct 51, an evaporator 53 (an indoor heat exchanger), an air mix door 54, and a heater core 55 (a heat exchanger for raising a temperature).

The air-conditioning duct 51 has air suction ports 56a and 56b, and air blowout ports 57a and 57b.

The blower 52, the evaporator 53, the air mix door 54 and the heater core 55 are sequentially disposed from an upstream side (on a side of the air suction ports 56a and 56b) toward a downstream side (on a side of the air blowout ports 57a and 57b) of the air-conditioning duct 51 in a flowing direction of the conditioning air.

The air suction ports 56a and 56b constitute an internal air suction port into which internal air is introduced, and an external air suction port into which external air is introduced. The air suction ports 56a and 56b are opened and closed by an internal air door 72 and an external air door 73, and for example, since opening degrees of the internal air door 72 and the external air door 73 are adjusted under control by the control device 15, a flow rate ratio between the internal air and the external air flowing through the air-conditioning duct 51 is adjusted. In the embodiment, the internal air door 72 and the external air door 73 constitute an internal and external air adjusting section.

The air blowout ports 57a and 57b constitute a VENT blowout port and a DEF blowout port, respectively. The air blowout ports 57a and 57b can be opened and closed by a VENT door 63 and a DEF door 64, respectively. The air blowout ports 57a and 57b can change a blowout position of the conditioning air in the passenger compartment because, for example, opening and closing of the VENT door 63 and the DEF door 64 are switched under control by the control device 15.

In the blower 52, a voltage applied to the driving motor is controlled by the control device 15. The blower 52 adjusts an air volume under control of the driving motor by the control device 15. The blower 52 delivers the conditioning air (at least one of the internal air and the external air) introduced into the air-conditioning duct 51 from the air suction ports 56a and 56b toward a downstream side, i.e., toward the evaporator 53 and the heater core 55.

The evaporator 53 performs heat exchange between a low temperature and low pressure coolant introduced thereinto and the conditioning air in the air-conditioning duct 51, and for example, cools the conditioning air passing through the evaporator 53 through heat absorption when a coolant is evaporated.

The heater core 55 performs heat exchange between a circulating liquid (a heat conducting coolant liquid) having a high temperature flowed thereinto and the conditioning air. The heater core 55 heats the conditioning air passing through the heater core 55 by radiating heat of the circulating liquid flowing therethrough.

For example, the air mix door 54 is pivoted and operated under control by the control device 15.

The air mix door 54 is pivoted between a heating position at which a ventilation route which is from a downstream side of the evaporator 53 toward the heater core 55 in the air-conditioning duct 51 is opened and a cooling position at which a ventilation route which bypasses the heater core 55 is opened. Accordingly, among the conditioning air which has passed through the evaporator 53, a ratio between the air volume of the conditioning air passing through the heater core 55 and the air volume of the conditioning air bypassing the heater core 55 is adjusted.

The coolant circuit 13 has an electric compressor 21 (a compressor), an outdoor heat exchanger 24 configured to cause heat exchange to be performed between a coolant compressed by the compressor 21 and an external air, an expansion valve 27 for cooling (an expansion valve) configured to compress the coolant that has performed heat exchange in the outdoor heat exchanger 24, and the evaporator 53 (the indoor heat exchanger) configured to cause heat exchange to be performed between the coolant compressed by the expansion valve 27 for cooling and the air flowing through the air conditioning unit 11. The coolant circuit 13 is filled with an air-conditioning coolant.

The compressor 21 is driven by a driving motor (not shown). The control device 15 controls a driving voltage of the driving motor, and thus, an output (for example, a rotational speed) of the compressor 21 can be changed. The compressor 21 compresses the coolant suctioned from an upstream side toward a downstream side. Pressure sensors P1 and P2 configured to detect pressures on a suction side and an ejection side of the compressor 21 are installed in the vicinity of the coolant circuit 13 on the suction side and the ejection side of the compressor 21. Detection signals of the pressure sensors P1 and P2 are output to the control device 15. The control device 15 controls the air-conditioning apparatus 10 or other instruments on the basis of the detection signals.

The outdoor heat exchanger 24 is connected to a downstream side of the compressor 21 in the coolant circuit 13.

The outdoor heat exchanger 24 is disposed outside the passenger compartment, and performs heat exchange between the high temperature and high pressure coolant flowing thereinto and the atmosphere outside the passenger compartment. In addition, an electrically driven outdoor fan 28 is installed on the outdoor heat exchanger 24. The outdoor fan 28 is appropriately driven under control by the control device 15, and heat radiation in the outdoor heat exchanger 24 is promoted.

The expansion valve 27 for cooling is connected to a downstream side of the outdoor heat exchanger 24 in the coolant circuit 13. For example, the expansion valve 27 for cooling decompresses and expands the coolant according to a valve opening degree controlled by the control device 15, and then, ejects the coolant to the evaporator 53 as a coolant in a spray form of two phases of a gas and a liquid (a gas phase rich) at a low temperature and a low pressure.

The evaporator 53 is connected to a downstream side of the expansion valve 27 for cooling and to a suction side of the compressor 21 in the coolant circuit 13. The evaporator 53 is disposed inside the air-conditioning duct 51 as described above, and performs heat exchange between a low temperature and low pressure coolant passing through the expansion valve 27 for cooling and the conditioning air in the air-conditioning duct 51. A heat storage member 90 (a heat storage section) configured to store cold heat generated in the evaporator 53 is attached to the evaporator 53. The heat storage member 90 is a metal member or other members having a high heat storage capacity. The coolant passing through the evaporator 53 is returned to a suction section of the compressor 21.

Further, reference numeral 7 in FIG. 1 is an auxiliary heat exchanger for cooling disposed to bridge a portion at upstream of the expansion valve 27 for cooling and a portion at downstream of the evaporator 53 in the coolant circuit 13. An auxiliary heat exchanger 7 for cooling performs heat exchange between the portion upstream from the expansion valve 27 for cooling and the portion downstream from the evaporator 53 upon performance of a cooling operation, and cools the coolant in the portion on the upstream side before entering the evaporator 53.

A temperature sensor T1 configured to detect a coolant temperature immediately after the coolant is ejected from the compressor 21 is installed close to an ejection side of the compressor 21 in the coolant circuit 13. In addition, a temperature sensor T2 configured to detect a temperature of a portion of the evaporator 53 in the vicinity of the heat storage member 90 is installed on the evaporator 53. Detection signals of the temperature sensors T1 and T2 are output to the control device 15. The control device 15 controls the air-conditioning apparatus 10 or other instruments on the basis of the detection signals.

In addition, the hot water circuit 8 is configured by connecting a main circuit 40 for heating and a cooling circuit 41 for heat generating parts. The main circuit 40 for heating and the cooling circuit 41 are filled with a circulating liquid (a heat conducting coolant liquid).

The main circuit 40 for heating has an electrically driven oil pump 42 configured to deliver a circulating liquid, an electric heater 43 such as a ceramic heater or the like configured to heat the circulating liquid, and the heater core 55 configured to cause heat exchange to be performed between the circulating liquid heated by the electric heater 43 and the conditioning air in the air-conditioning duct 51.

The cooling circuit 41 for heat generating parts is a circuit configured to cool electric parts or electronic parts that can easily generate heat, such as a motor, a generator, a power drive unit (PDU), a DC-DC converter, a charger, or the like, using the circulating liquid. While the electric vehicle Ve of the embodiment is an electric vehicle on which no engine is mounted, if the electric vehicle Ve is an electric vehicle on which an engine is mounted, such as a hybrid vehicle, the engine may be cooled by the cooling circuit 41.

The cooling circuit 41 has an introduction section 41a and a discharge section 41b for a circulating liquid. The introduction section 41a of the cooling circuit 41 is connected to a portion which is at a downstream from the heater core 55 in the main circuit 40 for heating. The discharge section 41b of the cooling circuit 41 is connected to a portion which is at an upstream from the oil pump 42 in the main circuit 40 for heating.

The cooling circuit 41 can be disconnected or connected with respect to the main circuit 40 for heating via a flow path switching valve 44 such as a three-way valve or the like. In a state in which the cooling circuit 41 is connected to the main circuit 40 for heating by the flow path switching valve 44, the circulating liquid having a temperature increased while passing through the cooling circuit 41 is returned to the oil pump 42, and the circulating liquid is further heated by the electric heater 43 and introduced into the heater core 55. For this reason, a temperature of the heater core 55 can be increased by effectively using heat of the heat generating parts. Further, the temperature of the heater core 55 can also be increased by only the heat of the circulating liquid having a temperature increased by the cooling circuit 41 without operating the electric heater 43 according to operation conditions of the air-conditioning apparatus 10.

The control device 15 controls the air-conditioning apparatus 10 on the basis of settings of various air-conditioning switches in the passenger compartment. Specifically, the control device 15 appropriately controls a rotational speed of the compressor 21, the outdoor fan 28, the blower 52, or the like, in the coolant circuit 13, an opening degree of the air mix door 54, an opening and closing state of the internal air door 72 and the external air door 73, the presence of an operation of the oil pump 42 of the hot water circuit 8, switching of the flow path switching valve 44, and so on, according to setting of an indoor temperature or a driving mode.

In addition, the control device 15 controls the electric motor 17 and the electrical storage device 16 according to driving operations or traveling conditions. Information of a state of charge (SOC) of electric power of the electrical storage device 16, information of regenerative power generation by the electric motor 17, or the like, is input to the control device 15. The control device 15 further controls the air-conditioning apparatus 10 to prevent overcharging of the electrical storage device 16 upon regenerative braking by the electric motor 17 on the basis of the input information thereof.

That is, the control device 15 performs an operation of the air-conditioning apparatus 10 (hereinafter, referred to as "an active electric power consuming operation") for actively consuming electric power of the electrical storage device 16 when information of the state of charge of the electrical storage device 16 and information of the regenerative power generation by the electric motor 17 have been received, and it is determined that regenerative braking (regenerative power generation) by the electric motor 17 is being performed (hereinafter, this condition is referred to as "overcharging regeneration") in a state in which the state of charge of the electrical storage device 16 is a predetermined value or more.

Figure 2:
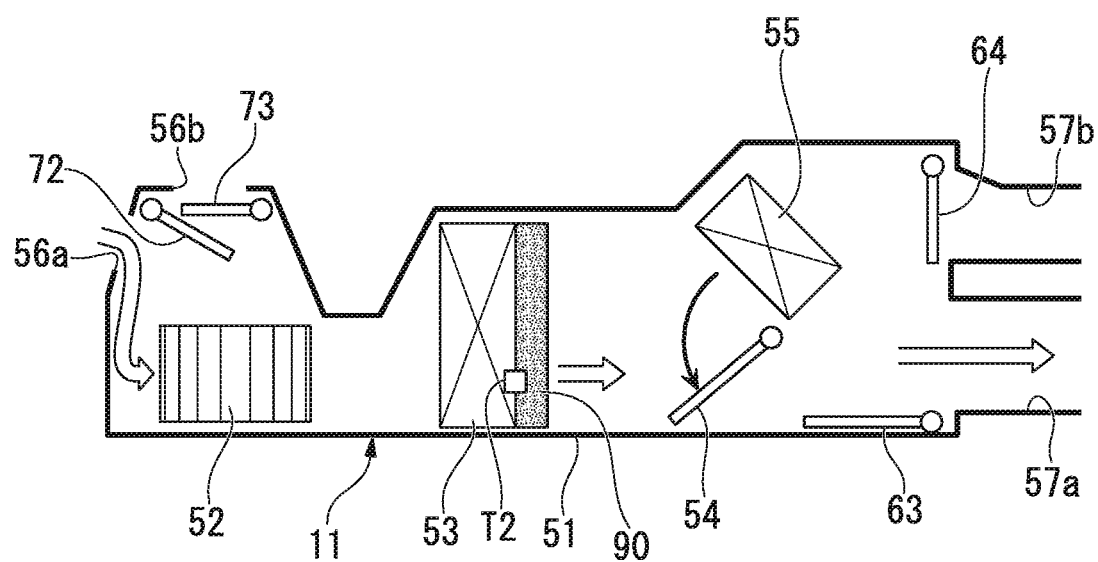
FIG. 2 is a configuration view showing a portion of the air-conditioning apparatus of the electric vehicle according to the embodiment of the present invention.

FIG. 2 is a view showing an example of operations of parts in the air conditioning unit 11 upon an active electric power consuming operation.

Figure 3:
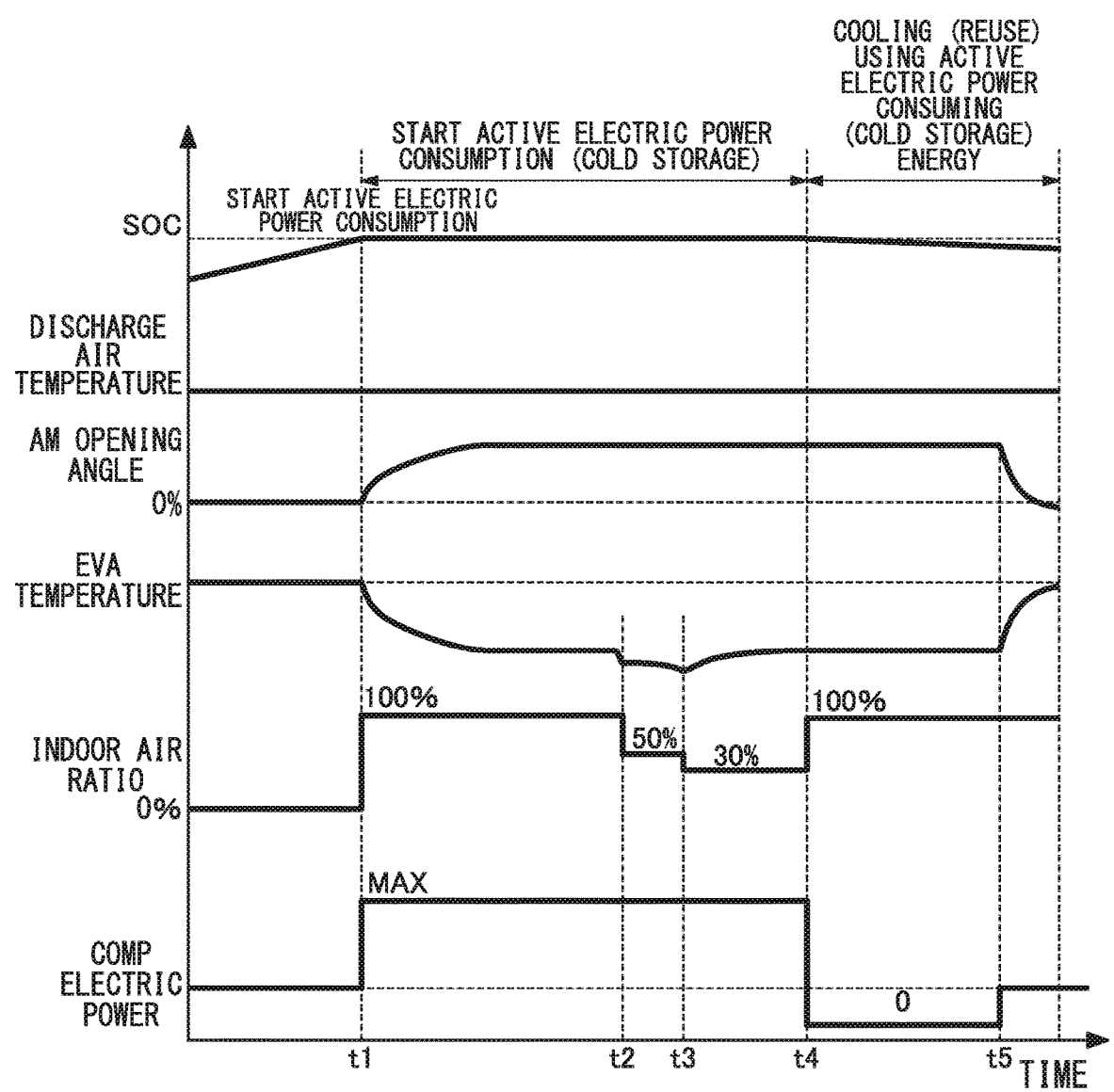
FIG. 3 is a timing chart showing states of parts of the air-conditioning apparatus of the electric vehicle according to the embodiment of the present invention.

In addition, FIG. 3 is a timing chart showing a state of parts of the air-conditioning apparatus 10 corresponding to elapsed time when the active electric power consuming operation is performed.

Specifically, the control device 15 controls the air-conditioning apparatus 10 to decrease a temperature of the evaporator 53 (the indoor heat exchanger) to be lower than when the state of charge of the electrical storage device 16 is less than the predetermined value in the case in which the state is determined as overcharging regeneration (see a state at t1 of "SOC" in FIG. 3). Here, for example, a rotational speed of the electrically driven compressor 21 is increased to a maximum speed (see a state at t1 of "COMP electric power" in FIG. 3). Accordingly, the temperature of the evaporator 53 is gradually decreased like "an EVA temperature" in FIG. 3. Here, the cold heat generated by the evaporator 53 is accumulated in the heat storage member 90 attached to the evaporator 53.

Further, when the state is determined as overcharging regeneration, as shown in FIG. 2, the control device 15 opens the internal air door 72 and closes the external air door 73 such that only the internal air is introduced into the air-conditioning duct 51.

Here, like the state at t1 of "an internal air proportion" in FIG. 3, the internal air proportion of the air introduced into the air-conditioning duct 51 becomes 100%. As a result, cold storage in the evaporator 53 including the heat storage member 90 is accelerated.

In this way, when the cold storage in the evaporator 53 is advanced, since the temperature of the evaporator 53 is excessively lowered, like states of t2 and t3 of "the EVA temperature" and "the internal air proportion" in FIG. 3, the internal air proportion of the air introduced into the air-conditioning duct 51 is gradually reduced according to a decrease in temperature of the evaporator 53. Accordingly, an abrupt decrease in temperature of the conditioning air blown out of the air-conditioning duct 51 into the passenger compartment is minimized (see "a discharge air temperature" in FIG. 3).

Further, even though it is determined that the control device 15 is in the overcharging regeneration, when the temperature of the evaporator 53 is a predetermined value or less that is sufficiently low, the internal air proportion of the air introduced into the air-conditioning duct 51 may be made to 0% (the external air ratio is 100%), and the compressor 21 may be operated at a speed lower than a maximum speed.

In addition, when it is determined that the control device 15 is in the overcharging regeneration, as shown in FIG. 2, an opening degree of the air mix door 54 is increased according to a decrease in temperature of the evaporator 53 (see "an AM opening degree" in FIG. 3). Accordingly, a proportion of the conditioning air passing through the heater core 55 (a heat exchanger for raising a temperature) is increased, and an abrupt decrease in temperature of the conditioning air blown out of the air-conditioning duct 51 into the passenger compartment is minimized (see "a discharge air temperature" in FIG. 3).

Further, in the embodiment, when it is determined that the control device 15 is in the overcharging regeneration and a temperature of the evaporator 53 is decreased, in order to minimize an excessive decrease in the temperature of the evaporator 53 and an excessive decrease in the indoor temperature, the internal air proportion is decreased by operations of the internal air door 72 and the external air door 73. However, as a means configured to minimize an excessive decrease in the indoor temperature, an air blowing amount of the blower 52 (the air blowing section) may be reduced.

In addition, after the above-mentioned active electric power consuming operation is terminated by termination of the regenerative braking (regenerative power generation) of the vehicle, the air-conditioning apparatus 10 performs a cooling operation (hereinafter, the cooling operation is referred to as "a cold storage cooling operation") using the cold heat accumulated in the evaporator 53 (the heat storage member 90) under control by the control device 15.

In a time t4 in FIG. 3, when the cold storage cooling operation is started, the control device 15 stops the operation of the compressor 21 (see "a COMP electric power" in FIG. 3), and performs heat exchange between the cold heat accumulated in the evaporator 53 (the heat storage member 90) and the conditioning air in this state. When the cold storage cooling operation is started, the internal air proportion is set to 100% by the operations of the internal air door 72 and the external air door 73, and the conditioning air is blown out into the passenger compartment in this state. Accordingly, the cold heat of the evaporator 53 (the heat storage member 90) can be used throughout for a long time as possible. Further, in the case in which the state of charge of the electrical storage device 16 is less than the predetermined value and the cold storage cooling operation is started, when the temperature of the conditioning air blown out of the air-conditioning duct 51 into the passenger compartment is the predetermined temperature or less (excessively decreased), an air blowing amount of the blower 52 is decreased.

When the cold storage cooling operation is continued, the temperature of the evaporator 53 is gradually increased. In a time t5 in FIG. 3, when the temperature of the evaporator 53 is increased to a predetermined temperature or more, the control device 15 returns an operation speed of the compressor 21 to a state which is before it was determined as the overcharging regeneration (see a state in t5 of "COMP electric power" in FIG. 3). In addition, the control device 15 operates the air mix door 54 in a closing direction (a direction toward an opening degree 0%) according to an increase in temperature of the evaporator 53. Accordingly, an abrupt increase in temperature of the conditioning air blown out of the air-conditioning duct 51 is minimized.

When the temperature of the evaporator 53 recovers to the temperature before it was determined as the overcharging regeneration, the control device 15 terminates the cold storage cooling operation using the air-conditioning apparatus 10 at that time. As a result, the air-conditioning apparatus 10 returns to a normal cooling operation.

Then, an example of control of the air-conditioning apparatus 10 of the electric vehicle Ve of the embodiment will be described with reference to FIG. 4.

Figure 4:
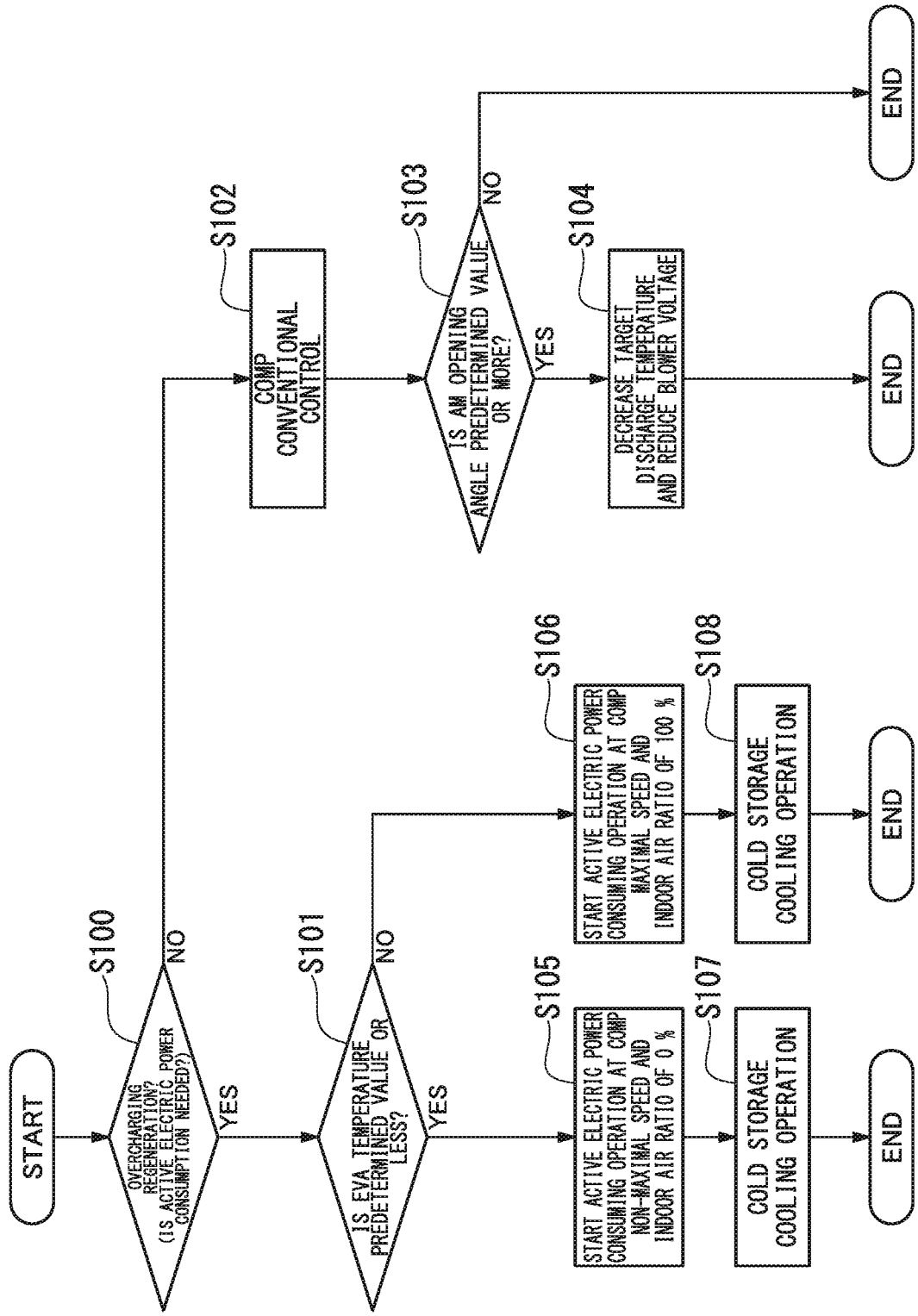
FIG. 4 is a flowchart showing an example of control of the air-conditioning apparatus of the electric vehicle according to the embodiment of the present invention.

In step S100 of FIG. 4, the control device 15 determines whether the state is in the overcharging regeneration at the present time (whether the active electric power consuming operation is needed), the processing advances to step S101 when the state is determined as the overcharging regeneration, and the processing advances to step S102 when the state is determined as not the overcharging regeneration.

When the processing advances to step S102, the operation of the air-conditioning apparatus 10 is performed in a normal mode in which electric power consumption of the electrical storage device 16 is suppressed. That is, in step S103, it is determined whether an opening degree of the air mix door 54 is a predetermined value or more, when the opening degree of the air mix door 54 is less than the predetermined value, the control is continued, and when the opening degree of the air mix door 54 is the predetermined value or more, a target temperature of the evaporator 53 is decreased and an applied voltage of the blower 52 is lowered to reduce the air volume. Accordingly, electric power consumption in the blower 52 is suppressed.

In addition, when the state is determined as the overcharging regeneration and the processing advances to step S101, in step S101, it is determined whether the current temperature of the evaporator 53 is the predetermined value or less, the processing advances to step S105 when the temperature of the evaporator 53 is the predetermined value or less, and the processing advances to step S106 when the temperature of the evaporator 53 is higher than the predetermined value.

In step S105, for example, the internal air proportion of the air introduced into the air-conditioning duct 51 is 0% (the external air ratio is 100%), the speed of the compressor 21 is lower than the maximum speed, and the active electric power consuming operation of the air-conditioning apparatus 10 is started. Then, when the regenerative braking of the vehicle is terminated after the active electric power consuming operation has been started, the processing advances to step S107 and is shifted to a cold storage cooling operation.

In addition, in step S106, the internal air proportion of the air introduced into the air-conditioning duct 51 is 100% (the external air ratio is 0%), the compressor 21 is at the maximum speed, and the active electric power consuming operation of the air-conditioning apparatus 10 is started. When the regenerative braking of the vehicle is terminated after the active electric power consuming operation has been started, the processing advances to step S108 and is shifted to the cold storage cooling operation.

As described above, when the control device 15 has determined the overcharging regeneration, the electric vehicle Ve of the embodiment controls the air-conditioning apparatus 10 such that the temperature of the evaporator 53 is decreased so as to be lower than the temperature of the evaporator 53 when the state of charge of the electrical storage device 16 is less than the predetermined value. For this reason, even though the regenerative braking is performed when the state of charge of the electrical storage device 16 is the predetermined value or more, since electric power is greatly consumed by the air-conditioning apparatus 10, an abrupt increase in the state of charge of the electrical storage device 16 due to the regenerative braking can be minimized.

Further, in the electric vehicle Ve of the embodiment, the electric power consumed by the air-conditioning apparatus 10 under the condition of the overcharging regeneration can be accumulated in the evaporator 53 (the heat storage member 90) as the cold heat. For this reason, heat exchange between the cold heat accumulated in the evaporator 53 (the heat storage member 90) and the conditioning air can be performed after the regenerative braking is terminated.

Accordingly, when the electric vehicle Ve of the embodiment is employed, energy (electric power) consumed by the air-conditioning apparatus 10 under the condition of the overcharging regeneration can be effectively used after termination of the regenerative braking.

In addition, when the control device 15 has determined the overcharging regeneration, the electric vehicle Ve of the embodiment controls the air-conditioning apparatus 10 such that the temperature of the evaporator 53 is decreased so as to be lower than the temperature of the evaporator 53 when the state of charge of the electrical storage device 16 is less than the predetermined value, and controls the internal air door 72 and the external air door 73 such that the internal air is introduced into the air-conditioning duct 51. For this reason, when the temperature of the evaporator 53 is decreased under the condition of the overcharging regeneration, the internal air circulates through the air-conditioning duct 51, and as a result, the cold heat can be efficiently accumulated in the evaporator 53 (the heat storage member 90).

Further, in the electric vehicle Ve of the embodiment, when the control device 15 has determined the overcharging regeneration, the air-conditioning apparatus 10 is controlled such that the temperature of the evaporator 53 is decreased so as to be lower than the temperature of the evaporator 53 when the state of charge of the electrical storage device 16 is less than the predetermined value, and the air mix door 54 is controlled such that the proportion of the conditioning air passing through the heater core 55 in the air-conditioning duct 51 is increased. For this reason, upon the active electric power consuming operation, most of the conditioning air cooled by the evaporator 53 is increased in temperature by the heater core 55. Accordingly, when the electric vehicle Ve of the embodiment is employed, excessive cooling of the conditioning air blown out of the air-conditioning duct 51 into the passenger compartment can be suppressed.

In addition, when the control device 15 has determined the overcharging regeneration, has decreased the temperature of the evaporator 53 so as to be lower than the temperature of the evaporator 53 when the state of charge of the electrical storage device 16 is less than the predetermined value, and then, the cold storage cooling operation has been started after the state of charge of the electrical storage device 16 has become less than the predetermined value, in the case in which the temperature of the conditioning air blown out of the air-conditioning duct 51 into the passenger compartment is the predetermined value or less (excessively low), the control device 15 reduces the air blowing amount of the blower 52. Accordingly, the air volume of the cold air blown out of the air-conditioning duct 51 can be minimized, and as a result, comfortability of an occupant in the passenger compartment can be appropriately maintained.

Figure 5:
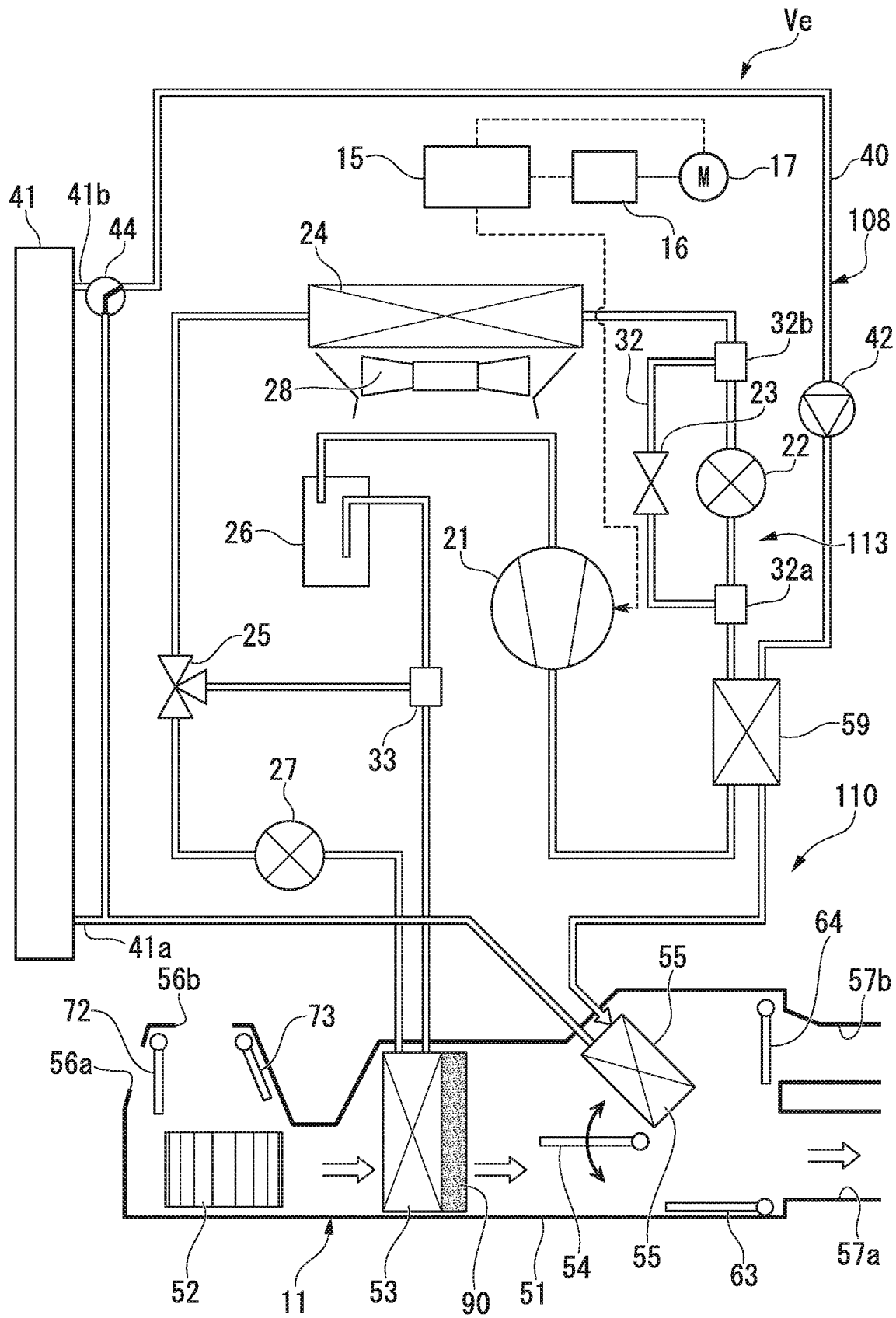
FIG. 5 is a configuration view centered on an air-conditioning apparatus of an electric vehicle according to another embodiment of the present invention.

Then, another embodiment shown in FIG. 5 will be described. While a basic configuration of the other embodiment is substantially the same as the above-mentioned embodiment, a configuration of an air-conditioning apparatus 110 is different from that of the above-mentioned embodiment. Further, common functional parts of the above-mentioned embodiment are designated by the same reference numerals, and overlapping description thereof will be partially omitted.

The air-conditioning apparatus 110 employed in the embodiment performs cooling and heating using a heat pump cycle. A coolant circuit 113 that constitutes the heat pump cycle includes a compressor 21, a condenser 59, an expansion valve 22 for heating, a bypass valve 23 for cooling, an outdoor heat exchanger 24, a three-way valve 25, an expansion valve 27 for cooling, an evaporator 53 and a gas-liquid separator 26.

The compressor 21 is installed between the gas-liquid separator 26 and the condenser 59, and suctions a gaseous coolant on the gas-liquid separator 26 side to eject the gaseous coolant toward the condenser 59. The expansion valve 22 for heating and the bypass valve 23 for cooling are disposed in parallel at downstream of the condenser 59. The expansion valve 22 for heating ejects the coolant passing through the condenser 59 to the outdoor heat exchanger 24 after being decompressed and expanded. The bypass valve 23 for cooling is installed on a bypass flow path 32 that bypasses the expansion valve 22 for heating while connecting a first branching section 32a and a second branching section 32b that are installed upstream and downstream of the expansion valve 22 for heating, respectively. The bypass valve 23 for cooling is in a closed state upon performance of a heating operation and is in an open state upon performance of a cooling operation.

In the outdoor heat exchanger 24, upon performance of the heating operation, a low temperature and low pressure coolant flowing thereinto absorbs heat from the atmosphere outside the passenger compartment. Meanwhile, in the outdoor heat exchanger 24, upon performance of the cooling operation, a high temperature and high pressure coolant flowing thereinto radiates heat to the atmosphere outside the passenger compartment.

The three-way valve 25 switches the ejection of the coolant discharged from the outdoor heat exchanger 24 to the gas-liquid separator 26 or the expansion valve 27 for cooling. The three-way valve 25 is connected to the outdoor heat exchanger 24, a joining section 33 disposed in the gas-liquid separator 26 side, and the expansion valve 27 for cooling, and for example, a flowing direction of the coolant is switched under control by the control device 15.

Upon performance of the heating operation, the three-way valve 25 ejects the coolant flowing out of the outdoor heat exchanger 24 toward the joining section 33 on a side of the gas-liquid separator 26. Meanwhile, upon performance of the cooling operation, the three-way valve 25 ejects the coolant flowing out of the outdoor heat exchanger 24 toward the expansion valve 27 for cooling.

In addition, the gas-liquid separator 26 is installed between the joining section 33 and the compressor 21 in the coolant circuit 113, a gas and a liquid of the coolant introduced from joining section 33 are separated, and a gaseous coolant (a coolant gas) is suctioned into the compressor 21. In addition, the evaporator 53 is connected to a downstream side of the expansion valve 27 for cooling. The evaporator 53 is installed between the expansion valve 27 for cooling and the joining section 33 (the gas-liquid separator 26).

When the air-conditioning apparatus 110 is operated in the heating operation mode, a high temperature and high pressure coolant ejected from the compressor 21 flows into the condenser 59, and heat is radiated in the condenser 59. The coolant passing through the condenser 59 is decompressed while passing through the expansion valve 22 for heating, and becomes a low temperature and low pressure coolant to flow into the outdoor heat exchanger 24. Here, heat is absorbed from outdoor atmosphere in the outdoor heat exchanger 24. Then, the coolant passing through the outdoor heat exchanger 24 flows into the gas-liquid separator 26 through the three-way valve 25.

The gaseous coolant separated by the gas-liquid separator 26 is returned to the compressor 21.

Meanwhile, when the air-conditioning apparatus 110 is operated in the cooling operation mode, the high temperature and high pressure coolant ejected from the compressor 21 flows into the outdoor heat exchanger 24 through the condenser 59 and the bypass valve 23 for cooling. Here, in the outdoor heat exchanger 24, heat of the coolant is radiated to the outdoor atmosphere. The coolant passing through the outdoor heat exchanger 24 enters the expansion valve 27 for cooling through the three-way valve 25, and flows into the evaporator 53 after being decompressed by the expansion valve 27 for cooling. Here, the coolant passing through the evaporator 53 absorbs heat from the conditioning air in the air-conditioning duct 51. Then, the coolant passing through the evaporator 53 flows into the gas-liquid separator 26, and a gas phase extend separated by the gas-liquid separator 26 is returned to the compressor 21.

In addition, a pipeline at downstream side of the oil pump 42 among the main circuit 40 for heating of a hot water circuit 108 is inserted to the condenser 59 of the coolant circuit 113. In the condenser 59, heat exchange between the coolant flowing therethrough and the circulating liquid flowing through the pipeline of the main circuit 40 for heating is performed. Accordingly, the circulating liquid flowing through the pipeline of the main circuit 40 for heating is heated by the heat of the condenser 59 when the coolant circuit 13 is operated in the heating operation mode. The circulating liquid in the hot water circuit 108 heated by the condenser 59 changes heat with the conditioning air in the heater core 55 disposed in the air-conditioning duct 51.

While the electric vehicle Ve of the embodiment is distinguished from the above-mentioned embodiment in that the air-conditioning apparatus 110 uses the heat pump cycle and the heater core 55 is heated by the heat of the condenser 59 heated through the heat pump cycle, the active electric power consuming operation, the cold storage cooling operation after that, or the like, can be performed like the above-mentioned embodiment upon the overcharging regeneration.

Accordingly, even in the embodiment, the same effects as the above-mentioned embodiment can be obtained.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. An electric vehicle comprising:
    an electric motor;
    an electrical storage device electrically connected to the electric motor;
    an air-conditioning apparatus configured to perform air conditioning in a passenger compartment; and
    a controller that controls the electric motor, the electrical storage device and the air-conditioning apparatus,
    wherein the air-conditioning apparatus includes a coolant circuit through which a coolant circulates,
    the coolant circuit has:
    a compressor configured to compress and eject a suctioned coolant;
    an outdoor heat exchanger configured to perform heat exchange between the coolant compressed by the compressor and an external air;
    an expansion valve configured to decompress the coolant that has performed heat exchange in the outdoor heat exchanger; and
    an indoor heat exchanger that is configured to perform heat exchange between the coolant decompressed by the expansion valve and conditioning air in a vehicle and that is configured to return the coolant to the compressor,
    the indoor heat exchanger has a heat storage section configured to store cold heat generated in the indoor heat exchanger, and
    in a case in which a regenerative braking by the electric motor is performed when a state of charge of the electrical storage device is a predetermined value or more, the controller controls the air-conditioning apparatus such that a temperature of the indoor heat exchanger is decreased by increasing a rotational speed of the compressor so as to be lower than a temperature of the indoor heat exchanger when the state of charge of the electrical storage device is less than a predetermined value, and the controller is configured to stop the compressor when the regenerative breaking is terminated.

2. The electric vehicle according to claim 1, wherein the air-conditioning apparatus includes an air-conditioning duct through which the conditioning air blown out into the passenger compartment flows, the indoor heat exchanger is disposed in the air-conditioning duct, and an internal and external air adjusting section configured to adjust a flow rate ratio between an internal air and the external air introduced into the air-conditioning duct is installed in the air-conditioning duct, and in a case in which a regenerative braking by the electric motor is performed when the state of charge of the electrical storage device is the predetermined value or more, the controller controls the air-conditioning apparatus such that the temperature of the indoor heat exchanger is decreased so as to be lower than the temperature of the indoor heat exchanger when the state of charge of the electrical storage device is less than the predetermined value, and controls the internal and external air adjusting section such that the internal air is introduced into the air-conditioning duct.

3. The electric vehicle according to claim 1, wherein the air-conditioning apparatus includes an air-conditioning duct through which the conditioning air blown out into the passenger compartment flows, the indoor heat exchanger is disposed in the air-conditioning duct, a heat exchanger for raising a temperature of air therearound and an air mix door configured to adjust a ratio between air passing through the heat exchanger for raising the temperature and air bypassing the heat exchanger for raising the temperature are disposed in the air-conditioning duct at a downstream side of the indoor heat exchanger, and in a case in which a regenerative braking by the electric motor is performed when the state of charge of the electrical storage device is the predetermined value or more, the controller controls the air-conditioning apparatus such that the temperature of the indoor heat exchanger is decreased so as to be lower than the temperature of the indoor heat exchanger when the state of charge of the electrical storage device is less than the predetermined value, and controls the air mix door such that a proportion of the conditioning air passing through the heat exchanger for raising a temperature is increased.

4. The electric vehicle according to claim 3, wherein an air blowing section configured to deliver air to the indoor heat exchanger is installed at an upstream of the indoor heat exchanger in the air-conditioning duct, and in a state in which the temperature of the indoor heat exchanger has been lowered, the controller controls the air-conditioning apparatus such that an air blowing amount of the air blowing section is decreased when the state of charge of the electrical storage device has become less than the predetermined value.

5. The electric vehicle according to claim 1, in a case in which a regenerative braking by the electric motor is performed when a state of charge of the electrical storage device is a predetermined value or more, the controller starts an active electric power consuming operation by controlling the air-conditioning apparatus such that a temperature of the indoor heat exchanger is decreased by increasing a rotational speed of the compressor so as to be lower than a temperature of the indoor heat exchanger when the state of charge of the electrical storage device is less than a predetermined value, and when the regenerative braking is terminated, the controller is configured to stop the compressor and to switch the air-conditioning apparatus to a cold storage cooling operation.

6. The electric vehicle according to claim 2, the internal and external air adjusting section is configured to adjust the flow rate ratio between the internal air and the external air introduced into the air-conditioning duct according to the temperature of the indoor heat exchanger.

7. The electric vehicle according to claim 6, the internal and external air adjusting section is configured to decrease the flow rate ratio between the internal air and the external air introduced into the air-conditioning duct according to a temperature decrease of the indoor heat exchanger.

* * * * *